(12) United States Patent
Mavroidis

(10) Patent No.: US 8,607,181 B1
(45) Date of Patent: Dec. 10, 2013

(54) METHOD FOR CONVERTING A SINGLE CHANNEL HARDWARE MODULE INTO A MULTI-CHANNEL MODULE

(75) Inventor: Dimitrios Mavroidis, Methuen, MA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 0 days.

(21) Appl. No.: 13/367,753

(22) Filed: Feb. 7, 2012

(51) Int. Cl.
G06F 17/50 (2006.01)

(52) U.S. Cl.
CPC ........ *G06F 17/5054* (2013.01); *G06F 17/5027* (2013.01); *G06F 17/5077* (2013.01); *G06F 17/505* (2013.01)
USPC ........... 716/116; 716/103; 716/104; 716/117; 716/121; 716/123; 716/124; 716/129; 716/130; 703/16

(58) Field of Classification Search
CPC .............. G06F 17/5054; G06F 17/505; G06F 17/5027; G06F 17/5077
USPC ......... 716/103, 104, 117, 121, 122, 123, 124, 716/129, 130, 116; 703/16
See application file for complete search history.

(56) References Cited

U.S. PATENT DOCUMENTS

| | | | | |
|---|---|---|---|---|
| 7,093,204 B2* | 8/2006 | Oktem et al. | ................ | 716/103 |
| 7,200,822 B1* | 4/2007 | McElvain | ................ | 716/101 |
| 7,640,519 B2* | 12/2009 | Oktem et al. | ................ | 716/116 |
| 7,765,506 B2* | 7/2010 | Oktem et al. | ................ | 716/103 |
| 7,823,162 B1* | 10/2010 | Keller et al. | ................ | 719/313 |
| 8,122,006 B2* | 2/2012 | de Castro Alves et al. | ... | 707/713 |
| 8,141,024 B2* | 3/2012 | Markov et al. | ................ | 716/132 |
| 8,161,437 B2* | 4/2012 | Oktem et al. | ................ | 716/104 |
| 8,230,285 B2* | 7/2012 | Lanning | ................ | 714/734 |
| 8,397,195 B2* | 3/2013 | Erickson | ................ | 716/110 |
| 8,418,104 B2* | 4/2013 | Oktem et al. | ................ | 716/110 |
| 2004/0199878 A1* | 10/2004 | Oktem et al. | ................ | 716/1 |
| 2006/0217949 A1* | 9/2006 | Chidhambarakrishnan | .... | 703/14 |
| 2006/0265685 A1* | 11/2006 | Oktem et al. | ................ | 716/18 |
| 2007/0174794 A1* | 7/2007 | Oktem et al. | ................ | 716/1 |
| 2010/0058261 A1* | 3/2010 | Markov et al. | ................ | 716/5 |
| 2010/0058278 A1* | 3/2010 | Oktem et al. | ................ | 716/18 |
| 2010/0287522 A1* | 11/2010 | Oktem et al. | ................ | 716/103 |
| 2011/0184717 A1* | 7/2011 | Erickson | ................ | 703/28 |
| 2012/0174053 A1* | 7/2012 | Markov et al. | ................ | 716/134 |

* cited by examiner

*Primary Examiner* — Phallaka Kik
(74) *Attorney, Agent, or Firm* — Turocy & Watson, LLP

(57) ABSTRACT

A system and method are provided for automatically converting a hardware abstraction language representation of a single-channel hardware module into a hardware abstraction language representation of a multi-channel module. Initially, a hardware abstraction language representation of a single channel hardware module is provided having an input port, output port, and a register. The method defines a number of channels and establishes a context switching memory. Commands are created for intercepting register communications. Commands are also created for storing the intercepted communications in a context switching memory, cross-referenced to channel. The module is operated using the created commands and stored communications from the context switching memory.

19 Claims, 10 Drawing Sheets

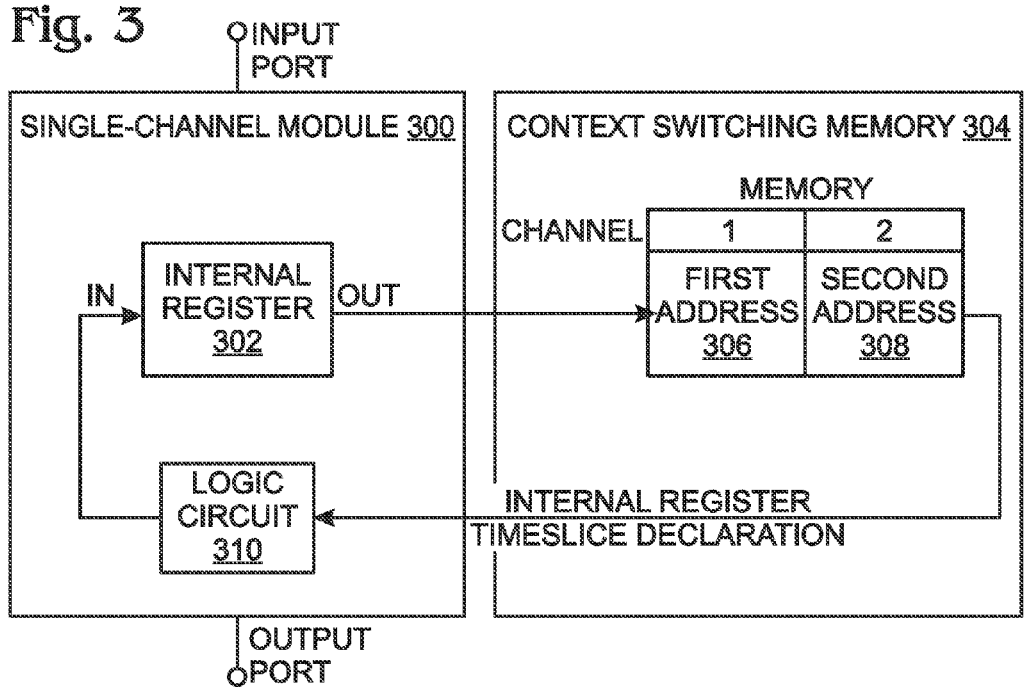
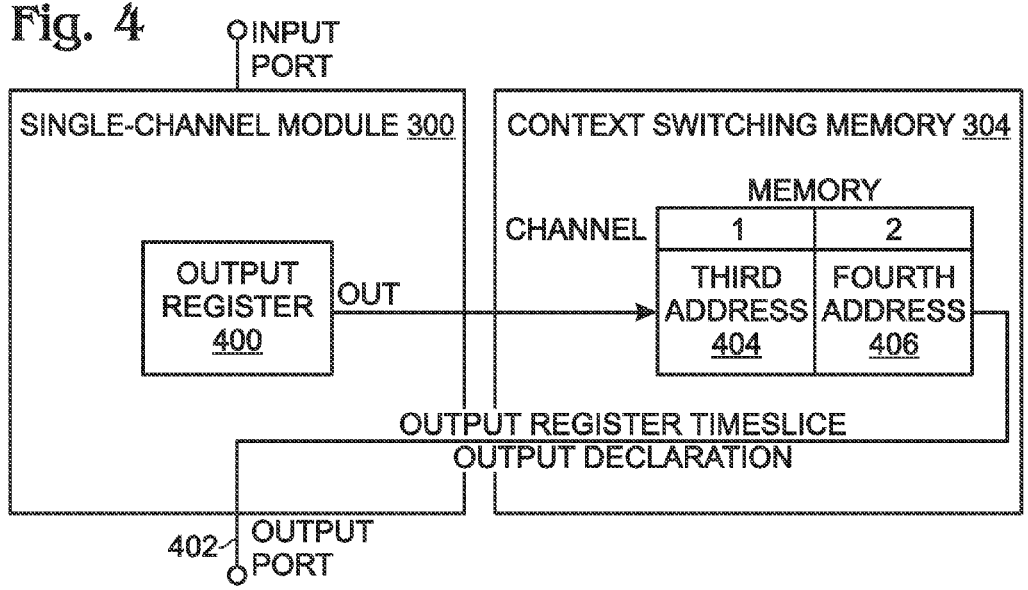

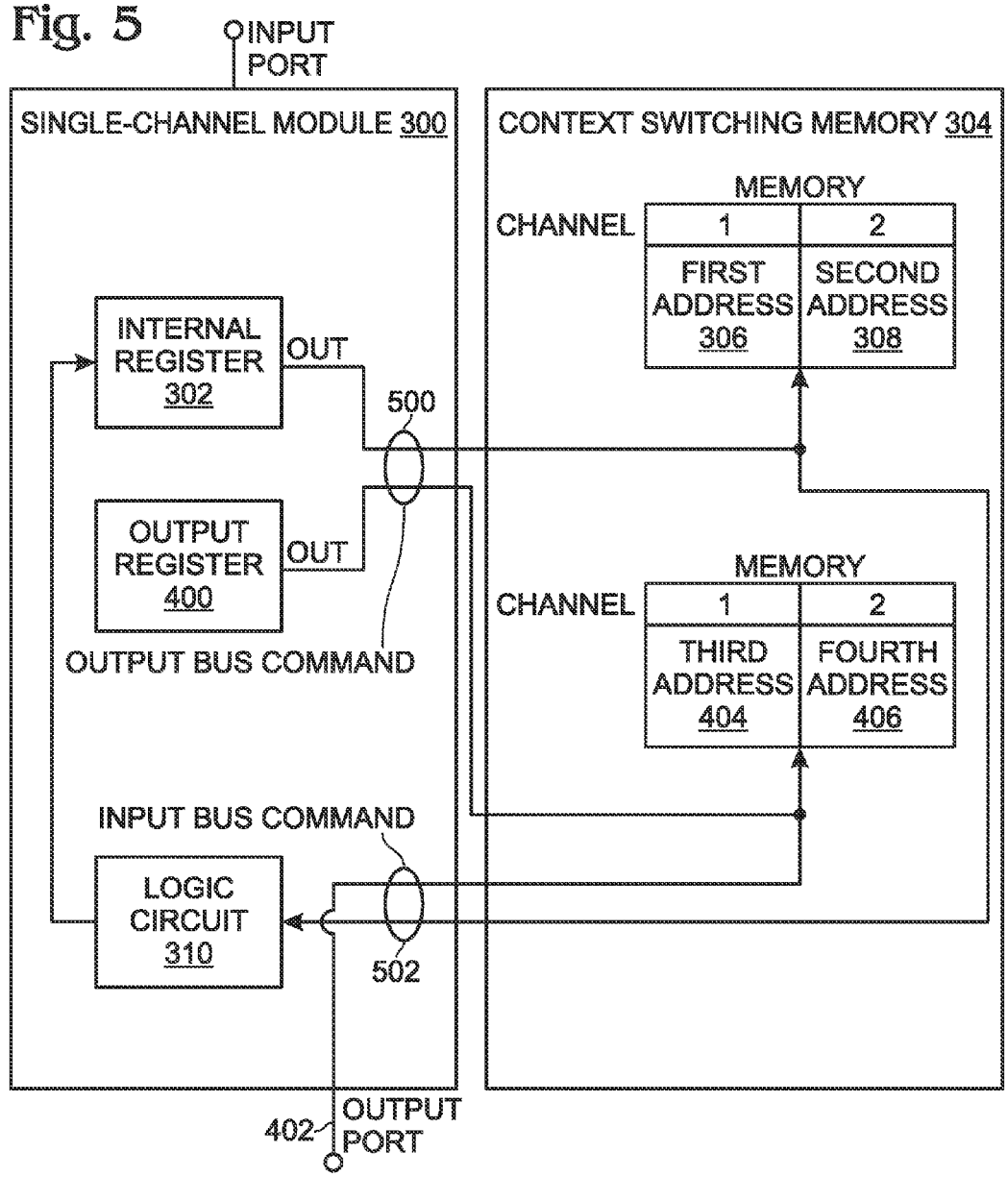

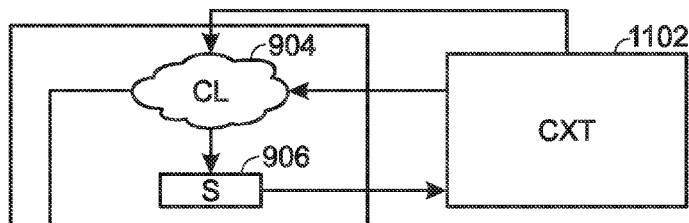
Fig. 13
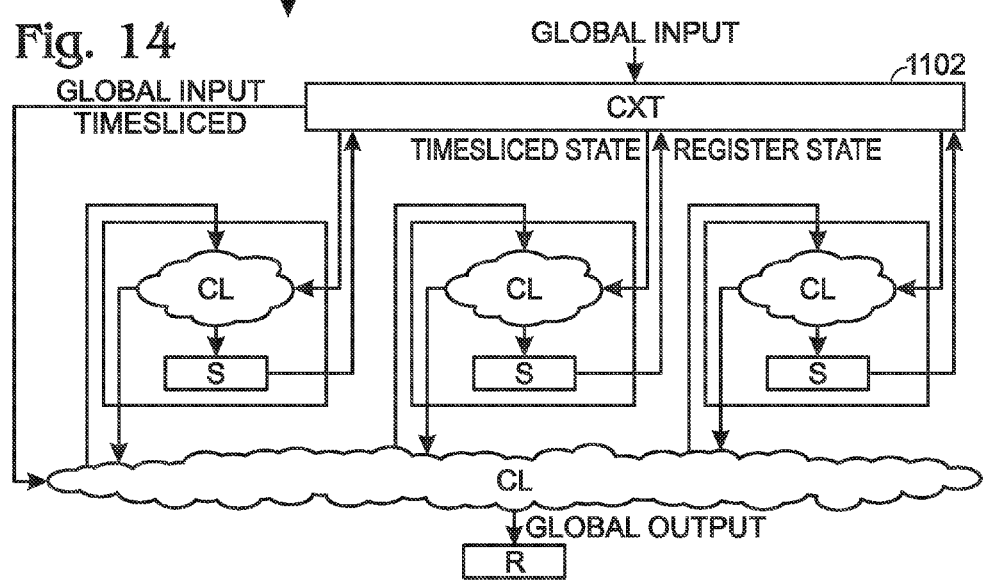
Fig. 14
Fig. 16
|  | 0 | 1 | 2 | 3 | 4 | 5 | 6 | 7 |
|---|---|---|---|---|---|---|---|---|
| cid in | A | B | C | A | D | B | C | A |
| DIN | IN1(A) | IN1(B) | IN1(C) | IN2(A) | IN1(D) | IN2(B) | IN2(C) | |
| DCI | | IN1(A) | IN1(B) | IN1(C) | IN2(A) | IN1(D) | IN2(B) | |
| SCI | | S1(A) | S1(B) | S1(C) | S2(A) | S1(D) | S2(B) | |
| SCO | | | S2(A) | S2(B) | S2(C) | S3(A) | S2(D) | |
| DOUT | | | DO1(A) | DO1(B) | DO1(C) | DO2(A) | DO1(D) | |
| MEM_WADDR | | | A | B | C | A | D | |
| MEM_WVAL | | | S2(A) | S2(B) | S2(C) | S3(A) | S2(D) | |
| MEM_RADDR | A | B | C | A | D | B | | |
| MEM_RDATA | | S1(A) | S1(B) | S1(C) | S2(A) | S1(D) | | |

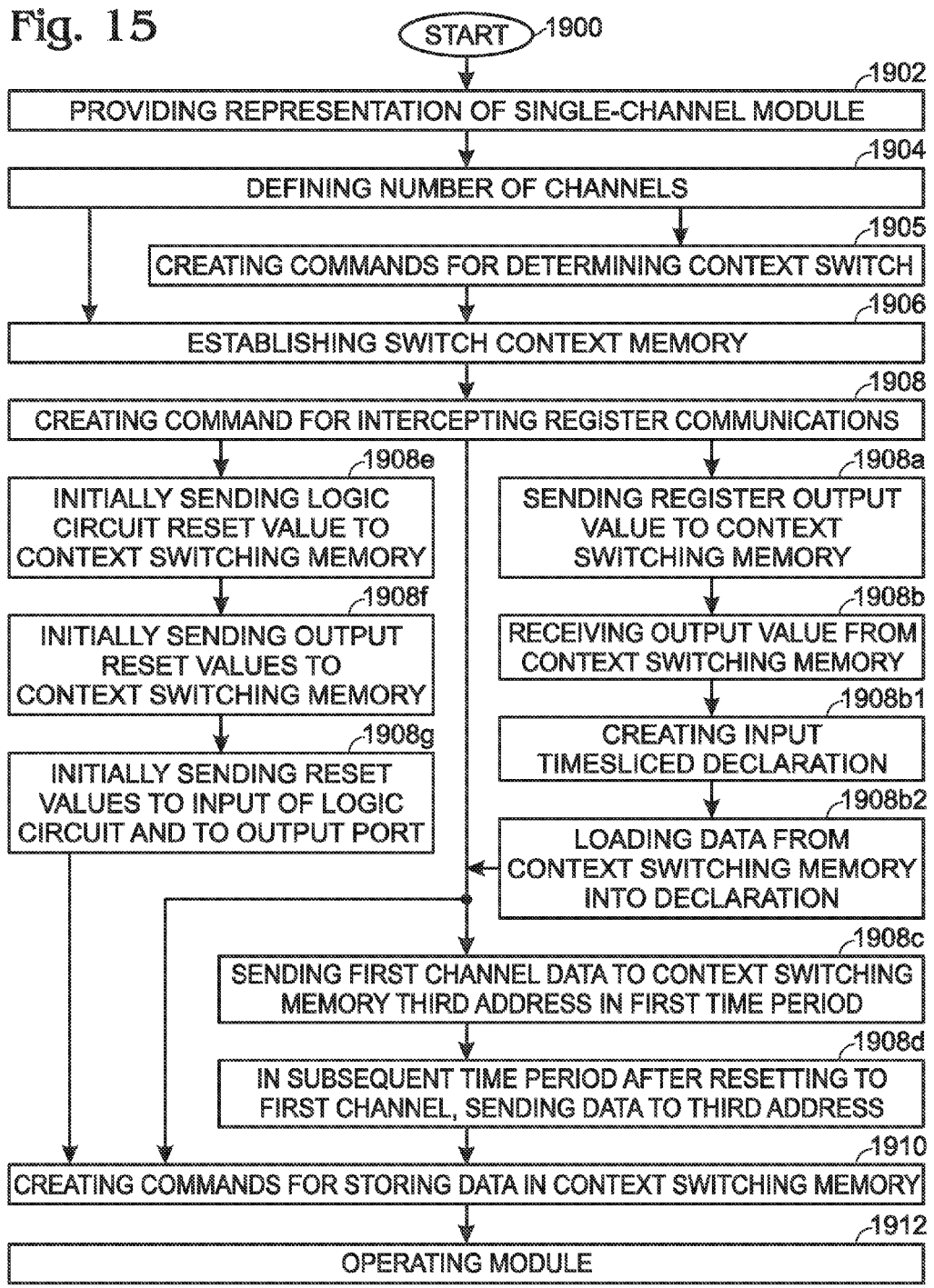

Fig. 17
| | 0 | 1 | 2 | 3 | 4 | 5 |
|---|---|---|---|---|---|---|
| cid in | A | A | B | A | | |
| DIN | IN1(A) | IN2(A) | IN1(B) | IN3(A) | | |
| DCI | | IN1(A) | IN2(A) | IN1(B) | IN3(A) | |
| SCI | | S1(A) | S2(A) | S1(B) | S3(A) | |
| SCO | | | S2(A) | S3(A) | S2(B) | S4(A) |
| DOUT | | DO1(A) | DO1(A) | DO1(B) | DO3(A) | |
| MEM_WADDR | | | A | A | B | A |
| MEM_WVAL | | | S2(A) | S3(A) | S2(B) | S4(A) |
| MEM_RADDR | A | --- | B | --- | | |
| MEM_RDATA | | S1(A) | --- | S1(B) | --- | |
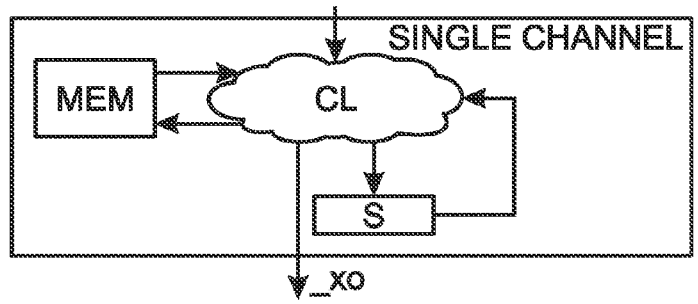
Fig. 18A
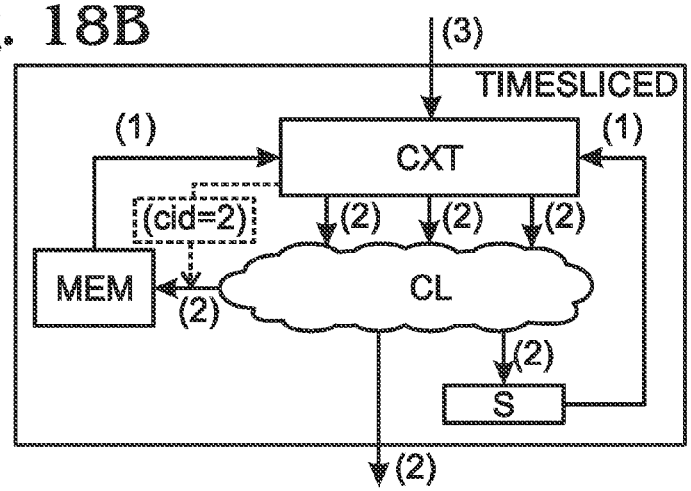
Fig. 18B

METHOD FOR CONVERTING A SINGLE CHANNEL HARDWARE MODULE INTO A MULTI-CHANNEL MODULE

BACKGROUND OF THE INVENTION

1. Field of the Invention

This invention generally relates to hardware description language programming and, more particularly to a method for automatically converting software for single-channel hardware modules to multi-channel modules.

2. Description of the Related Art

As noted in Wikipedia, the semiconductor and electronic design industry uses Verilog, a hardware description language (HDL) to model electronic systems. Verilog HDL and equivalent languages are most commonly used in the design, verification, and implementation of digital logic chips at the register transfer level (RTL) of abstraction. It is also used in the verification of analog and mixed-signal circuits.

Hardware description languages such as Verilog differ from software programming languages because they include ways of describing the propagation of time and signal dependencies (sensitivity). There are two assignment operators, a blocking assignment (=), and a non-blocking (<=) assignment. The non-blocking assignment allows designers to describe a state-machine update without needing to declare and use temporary storage variables. In any general programming language some temporary storage spaces are defined for the operands to be operated on subsequently; those are temporary storage variables. Since these concepts are part of Verilog's language semantics, designers can quickly write descriptions of large circuits, in a relatively compact and concise form.

A Verilog design consists of a hierarchy of modules. Modules encapsulate design hierarchy, and communicate with other modules through a set of declared input, output, and bidirectional ports. Internally, a module can contain any combination of the following: net/variable declarations (wire, reg, integer, etc.), concurrent and sequential statement blocks, and instances of other modules (sub-hierarchies). Sequential statements are placed inside a begin/end block and executed in sequential order within the block. But the blocks themselves are executed concurrently, qualifying Verilog as a dataflow language.

Timeslicing is a technique used in digital designs in order to run multiple independent streams of data through the same RTL block. Each stream is assigned a channel number and a percentage of the available time slots. From an external observer's view point it appears as though there are multiple RTL engines each processing one channel. However, internally there is only one engine that keeps switching states every time a new channel's data come in—something that can happen as often as once per clock cycle.

Conventional timeslicing methods are not automated. All conversion needs to be done manually, which has a number of obvious disadvantages, as it requires a lot more time to implement. Manual implementation is subject to designer errors, requiring additional verification and debugging time. Once the conversion has been done manually, one can't go back to the single channel code, make changes, and easily apply these changes to the timesliced code.

Conventional methods do not treat the entire design as a single flat module. Instead they use the "channel id pipelining" technique, which means that every individual block in the design operates on a different channel at each clock cycle. Each block in the internal pipeline processes one channel's data and sends this data along with the channel number to the next block. The disadvantages of this approach are many, depending on the design, as it may greatly increase the complexity of the conversion. This approach fails and tedious workarounds are necessary when dependencies exist between pipeline stages, like feed backward and feed forward information, or dependencies on constant delays between pipeline stages. Verification also becomes a lot harder, as at any given point in time data from multiple channels coexists inside the design.

FIG. 1 is a schematic block diagram illustrating a central problem associated with timeslice conversion (prior art). In a timesliced design, each piece of input/output data is associated with a channel id. For example, data "IN1" becomes associated with channel "CID1", and data IN2 associated with channel "CID2", etc. Each channel's I/O when viewed independently should match the single channel operation. The main problem is dealing with the state of each module. At each clock cycle, the current state has to be saved into memory (RAM) and the next state loaded from memory.

It would be advantageous if timeslice conversion could be performed automatically, without manual interpretation.

SUMMARY OF THE INVENTION

Disclosed herein is a timeslicing methodology that can be automated. The methodology is also design agnostic. The original single channel code is fully preserved, and conversion requires minimal register transfer level (RTL) code intrusion. Verification is gradual and only needs to use single channel tests. A central context switch module provides flexibility of state storage.

Accordingly, a method is provided for automatically converting a hardware abstraction language representation of a single-channel hardware module into a hardware abstraction language representation of a multi-channel module. Initially, a hardware abstraction language representation of a single-channel module is provided having an input port, output port, and a register. The method defines a number of channels and establishes a context switching memory. Commands are created for intercepting register communications. Commands are also created for storing the intercepted communications in a context switching memory, cross-referenced to channel. The module is operated using the created commands and stored communications from the context switching memory.

For example, the method may create commands for determining a context switch from a first channel to a second channel. Then, creating commands for intercepting register communications includes: sending an output value to the context switching memory, redirected from the register, cross-referenced to the first channel; and, receiving an output value from the context switching memory that is associated with the register and cross-referenced to the second channel.

Typically, the hardware module includes an internal register and a combinational logic circuit. Then, creating commands for intercepting register communications includes sending data from the output of the internal register to a context switching memory first address associated with the internal register and cross-referenced to the first channel. The commands also include the combinational logic circuit receiving data from a context switching memory second address associated with the internal register and cross-referenced to a second channel. The logic circuit processes the data, which is then supplied to the input of the internal register. For example, receiving data from the context switching memory second address may include creating a timesliced input port declaration associated with the internal register, and loading data received from the context switching memory second address into the timesliced input port declaration.

Additional details of the above-described method and a system for automatically converting a single channel hardware module into a multi-channel hardware module are provided below

BRIEF DESCRIPTION OF THE DRAWINGS

FIG. 3 is a schematic block diagram depicting a hardware abstraction language representation of a timesliced multi-channel module.

FIG. 4 is a schematic block diagram depicting a first variation of the hardware abstraction language representation of a timesliced multi-channel module.

FIG. 5 is a schematic block diagram depicting a second variation of the hardware abstraction language representation of a timesliced multi-channel module.

FIG. 13 is a schematic block diagram depicting a design that moves the location of the CXT block outside the block.

FIG. 14 is a schematic block diagram depicting a multi-level design with the CXT block moved outside the block.

FIG. 15 is a flowchart illustrating a method for automatically converting a hardware abstraction language representation of a single-channel hardware module into a hardware abstraction language representation of a multi-channel module.

FIG. 16 depicts a timing diagram associated with the module of FIG. 11, assuming that the same channel does not arrive in consecutive or nearly consecutive cycles.

FIG. 17 is a timing diagram for the module of FIG. 11, with state bypassing.

FIGS. 18A and 18B are, respectively, single-channel and timesliced modules that use memory.

DETAILED DESCRIPTION

Figure 1:
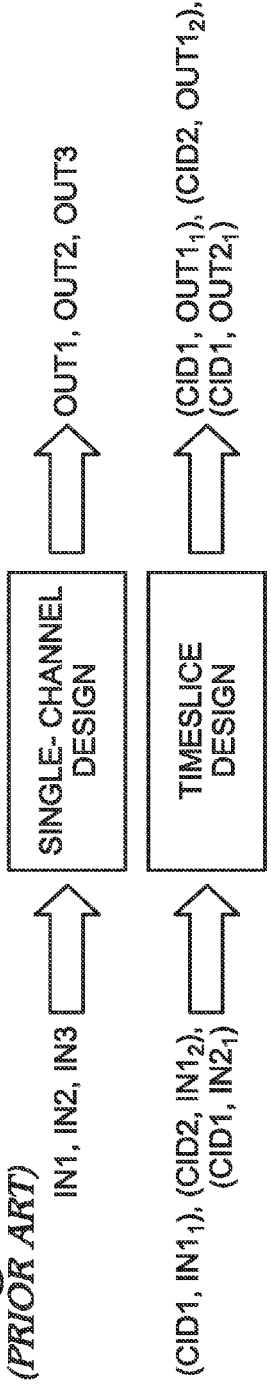
FIG. 1 is a schematic block diagram illustrating a central problem associated with timeslice conversion (prior art).
Figure 2:
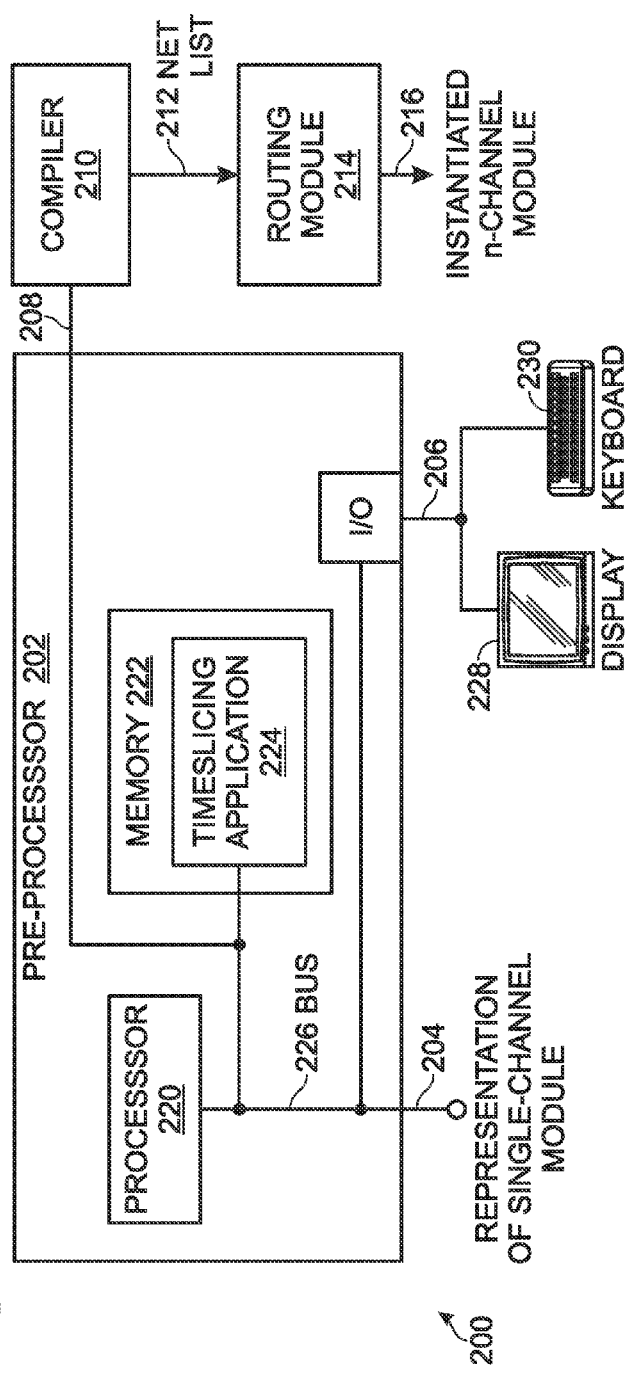
FIG. 2 is a schematic block diagram depicting a system for automatically converting a single-channel hardware module into a multi-channel module.

FIG. 2 is a schematic block diagram depicting a system for automatically converting a single-channel hardware module into a multi-channel module. The system 200 comprises a pre-processor 202 having an input to accept a hardware abstraction language representation of a single-channel hardware module on line 204, a user interface on line 206 to accept a command selecting a number of channels (n), and an output on line 208 to supply a hardware abstraction language representation of an n-channel module;

A compiler 210 has an input on line 208 to accept the hardware abstraction language representation of the n-channel module, and an output on line 212 to supply a net list representing a combination of logic gates enabling the n-channel module. A routing module 214 has an input on line 212 to accept the net list and an output on line 216 for supplying an instantiated n-channel hardware module in a device that is most typically configured as a field programmable gate array (FPGA) or an application-specific integrated circuit (ASIC). The functions of the complier and routing module are well understood in the art, and it should be understood that any conventional design of these modules can be used in enabling system 200.

As used in this application, the terms "component," "module," "system," and the like may be intended to refer to an automated computing system entity, such as hardware, firmware, a combination of hardware and software, software, software stored on a computer-readable medium, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

The pre-processor described below (as well as complier and routing module) typically employ a computer system with a bus or other communication mechanism for communicating information, and a processor coupled to the bus for processing information. The pre-processor may also include a main memory, such as a random access memory (RAM) or other dynamic storage device, coupled to the bus for storing information and instructions to be executed by a processor. These memories may also be referred to as a computer-readable medium. The execution of the sequences of instructions contained in a computer-readable medium may cause a processor to perform some of the steps associated with creating a timesliced conversion of a single-channel hardware module. Alternately, these functions, or some of these functions may be performed in hardware. The practical implementation of such a computer system would be well known to one with skill in the art.

As used herein, the term "computer-readable medium" refers to any medium that participates in providing instructions to a processor for execution. Such a medium may take many forms, including but not limited to, non-volatile media, volatile media, and transmission media. Non-volatile media includes, for example, optical or magnetic disks. Volatile media includes dynamic memory. Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

The pre-processor 202 includes a processor 220 and a memory 222. The interfaces on lines 204 and 208 may be network interfaces. As shown, the interfaces on lines 204 and 208 may be more than one interface. The interface may be a modem, an Ethernet card, or any other appropriate data communications device. The physical communication links may be optical, wired, or wireless. Alternatively, interfaces 204 and 208 may be drives to read and write a computer-readable medium.

The means of controlling the pre-processor 202 may be a timeslicing software application 224 stored in the memory 222. The timeslicing application may be enabled as a software application of sequential instructions stored in the memory 222 and executed by the processor 220. Alternately but not shown, the pre-processor may be completely or partially enabled in hardware as a state machine type logic module (e.g., a field programmable gate array (FPGA)). The pre-processor 202 may be a personal computer (PC), workstation, or server. The processor or central processing unit (CPU) 220 may be connected to memory 222 via an interconnect bus 226. The processor 220 may include a single microprocessor, or may contain a plurality of microprocessors for configuring the computer device as a multi-processor system. Further, each processor may be comprised of a single core or a plurality of cores. The memory 222 may include a main memory, a read only memory, and mass storage devices such as various disk drives, tape drives, etc. The main memory typically includes dynamic random access memory (DRAM) and high-speed cache memory. In operation, the main memory stores at least portions of instructions and data for execution by the processor 220.

The memory 222 may also comprise a mass storage with one or more magnetic disk or tape drives or optical disk drives, for storing data and instructions for use by processor 220. For a workstation PC, for example, at least one mass storage system in the form of a disk drive or tape drive, stores the operating system and application software. The mass storage may also include one or more drives for various portable media, such as a floppy disk, a compact disc read only memory (CD-ROM), or an integrated circuit non-volatile memory adapter (i.e. PC-MCIA adapter) to input and output data and code to and from the pre-processor 202.

The pre-processor 202 may further include appropriate input/output ports on lines 206 with a display 228 and a keyboard 230 for inputting alphanumeric and other key information. The pre-processor may include a graphics subsystem to drive the output display 226. The input control devices on line 206 may further include a cursor control device (not shown), such as a mouse, a touchpad, a trackball, stylus, or cursor direction keys. The links to the peripherals on line 206 may be wired connections or use wireless communications. Although not explicitly shown, the pre-processor 202 may further comprise co-processors, associated digital signal processors (DSPs), and associated graphics processing units (GPUs).

FIG. 3 is a schematic block diagram depicting a hardware abstraction language representation of a multi-channel module. Using a two-channel module as a general example, the pre-processor creates commands for determining a context switch from a first channel to a second channel. The pre-processor creates commands for intercepting register communications by sending an output value to the context switching memory, redirected from the register, cross-referenced to the first channel, and receiving an output value from the context switching memory that is associated with the register and cross-referenced to the second channel.

In one aspect, the hardware abstraction language representation of the multi-channel module 300 includes an internal register 302. In some aspects, the internal register (and the output register presented below, see FIG. 4) may be seen as a single "flat" register. The pre-processor creates commands for intercepting register communications by sending data from the output of the internal register to a context switching memory 304 first address 306 associated with the internal register 302 and cross-referenced to first channel. An input to a combinational logic circuit 310 receives data from a context switching memory second address 308 associated with the internal register and cross-referenced to a second channel. As used herein, a combinational logic circuit uses hardware-enabled gates to perform logical operations such as AND, NAND, and XOR, to name a few examples. After processing the data, the logic circuit supplies the processed data associated with the second channel to the input of the internal register 302.

The pre-processor creates commands for receiving data from the context switching memory second address by creating a timesliced input declaration associated with the internal register and loading data received from the context switching memory second address into the timesliced input declaration, which is supplied to the input of the combinational logic circuit 310.

FIG. 4 is a schematic block diagram depicting a first variation of the hardware abstraction language representation of a timesliced multi-channel module. In this aspect the hardware abstraction language representation of the multi-channel module 300 includes an output register 400 associated with the output port 402. The pre-processor creates commands for intercepting register communications by sending data from the output of the output register to the context switching memory third address 404 associated with the output register and cross-referenced to a first channel. The output port 402 receives data from a context switching memory fourth address 406 associated with the output register and cross-referenced to a second channel. In one aspect, the pre-processor creates a timesliced output declaration associated with the output port, and loads data received from the context switching memory fourth address into the timesliced output declaration.

FIG. 5 is a schematic block diagram depicting a second variation of the hardware abstraction language representation of a timesliced multi-channel module. In this aspect, the hardware abstraction language representation of the multi-channel module 300 includes an internal register 302, combinational logic circuit 310, and an output register 400 associated with the output port 402. The pre-processor creates commands for intercepting register communications by creating a hardware module output bus command 500 for sending data from the output of the internal register 302 to the context switching memory first address 306 associated with the internal register and cross-referenced to the first channel, and sending data from the output of the output register 400 to a context switching memory third address 404 associated with the output register and cross-referenced to the first channel.

The pre-processor also creates a hardware module input bus command 502 for sending data to the input of the combinational logic circuit 310 from the context switching memory second address 308 associated with the internal register and cross-referenced to the second channel, and sending data to the output port 402 from a context switching memory fourth address 406 associated with the output register and cross-referenced to the second channel.

Figure 6:
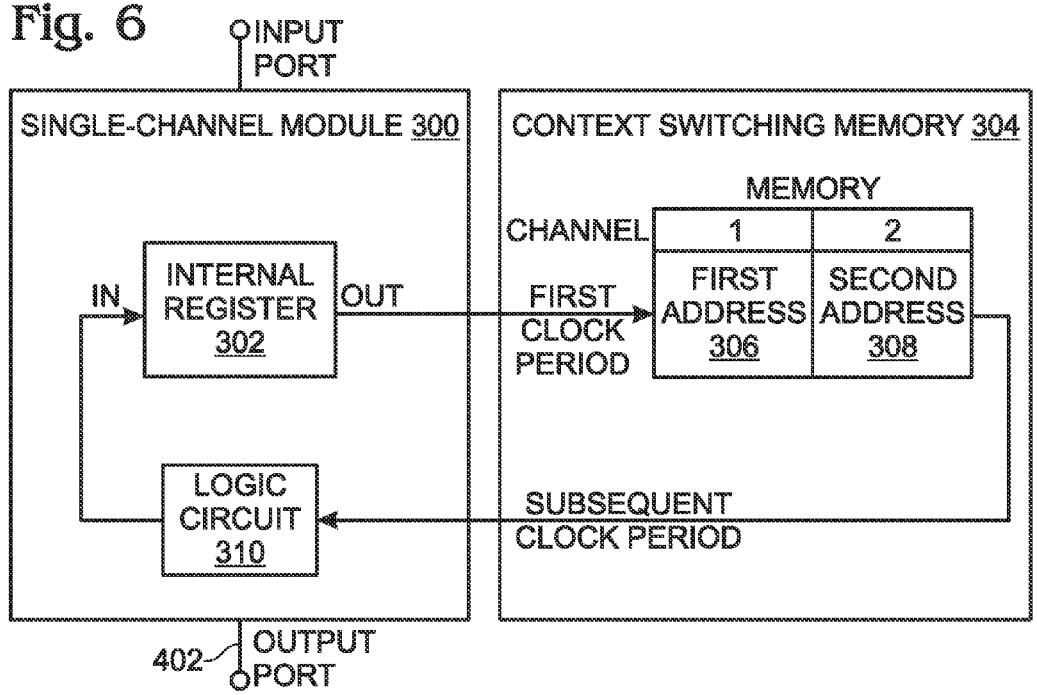
FIG. 6 is a schematic block diagram depicting a third variation of the hardware abstraction language representation of a time-sliced multi-channel module.

FIG. 6 is a schematic block diagram depicting a third variation of the hardware abstraction language representation of a timesliced multi-channel module. As in FIG. 3, the hardware abstraction language representation of the multi-channel module 300 includes an internal register 302 and s combinational logic circuit 310. The pre-processor creates commands for intercepting register communications as follows. In a first clock period, and in response to determining that the context switch is set to the first channel, data is sent from the output of the internal register 302 to the context switching memory first address 306 associated with the internal register and cross-referenced to the first channel.

In a subsequent clock period occurring after the first clock period, and in response to determining that the context switch has been reset to the first channel, the input to the logic circuit 310 receives data from the context switching memory first address 306, which is then processed and supplied to the input of the internal register 302.

Figure 7:
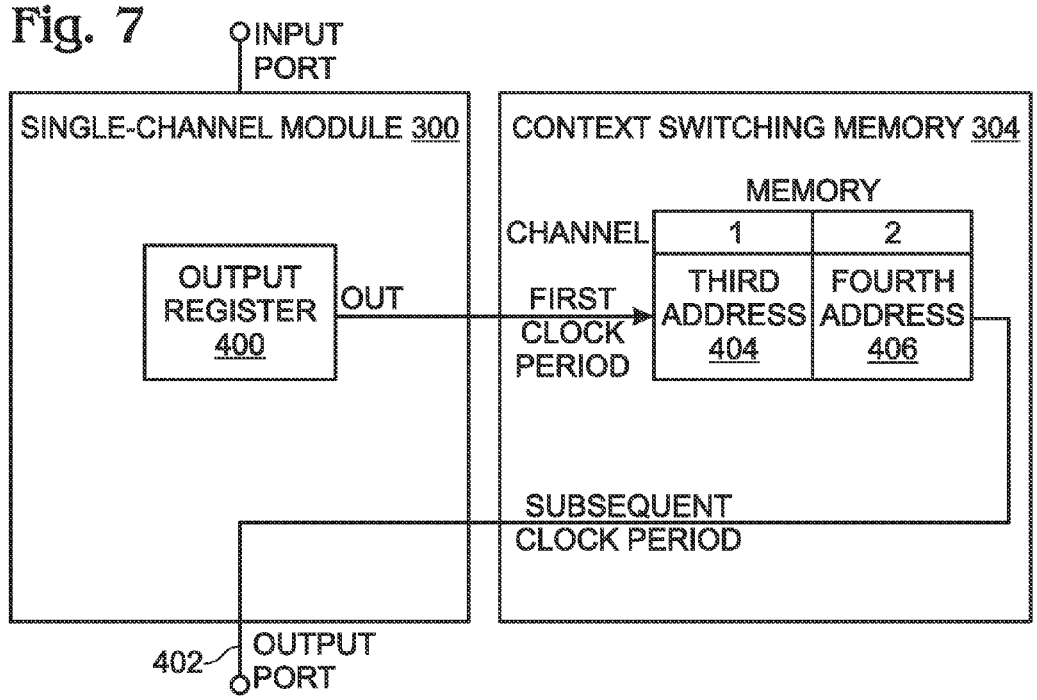
FIG. 7 is a schematic block diagram depicting a fourth variation of the hardware abstraction language representation of a timesliced multi-channel module.

FIG. 7 is a schematic block diagram depicting a fourth variation of the hardware abstraction language representation of a timesliced multi-channel module. In this aspect the hardware abstraction language representation of the multi-channel module 300 includes an output register 400 associated with the output port 402, as in FIG. 4. The pre-processor creates commands for intercepting register communications as follows. In a first clock period, and in response to determining that the context switch is set to the first channel, data is sent from the output register 400 to the context switching memory third address 404 associated with the output register and cross-referenced to the first channel. In a subsequent clock period occurring after the first clock period, and in response to determining that the context switch has been reset to the first channel, the output port 402 receives data from a context switching memory third address 404.

Figure 8:
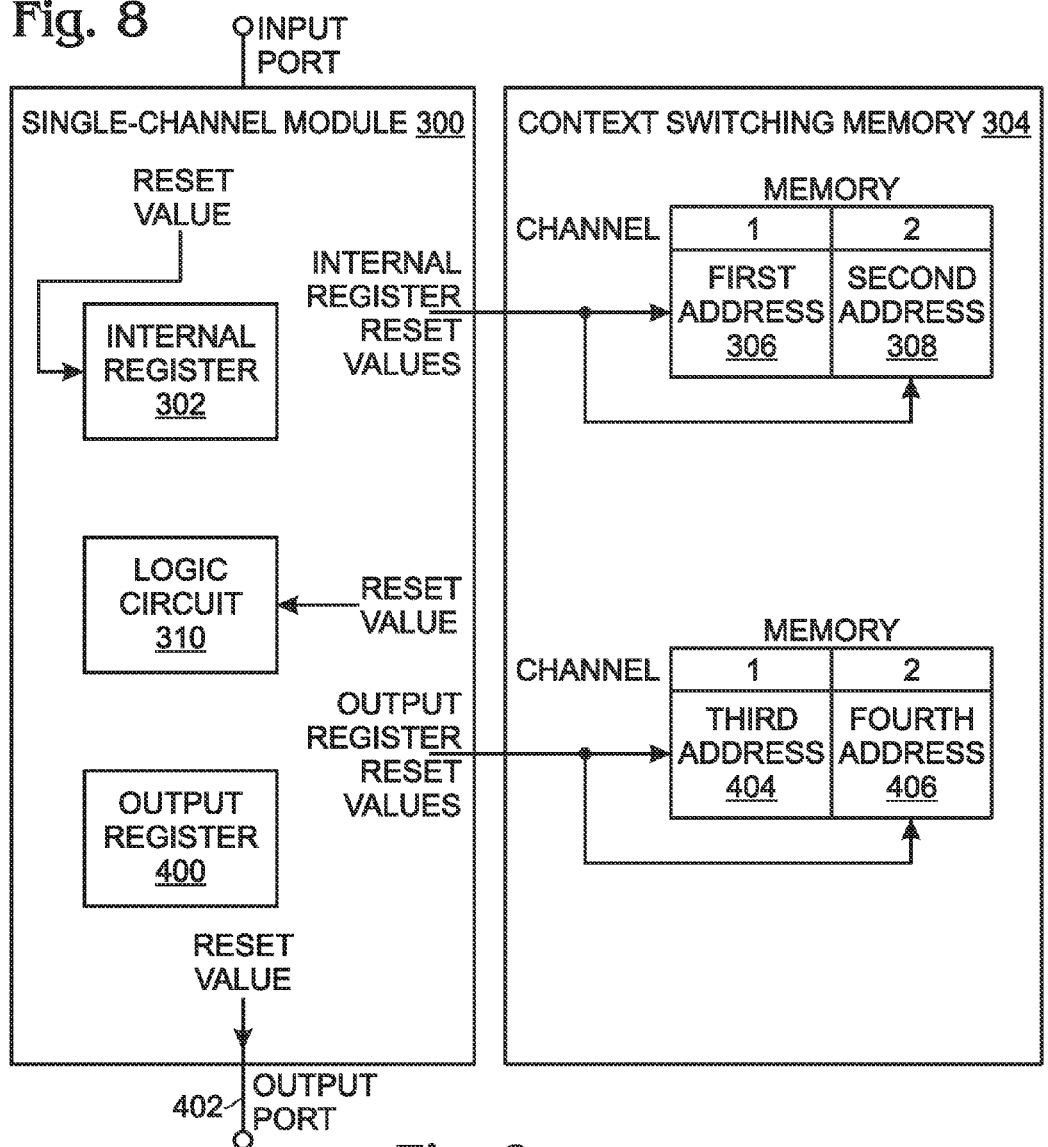
FIG. 8 is a schematic block diagram depicting a fifth variation of the hardware abstraction language representation of a timesliced multi-channel module.

FIG. 8 is a schematic block diagram depicting a fifth variation of the hardware abstraction language representation of a timesliced multi-channel module. As is FIG. 5, the hardware abstraction language representation of the multi-channel module 300 includes an internal register 302, logic circuit 310, and an output register 400 associated with the output port 402. In this aspect the pre-processor creates commands for intercepting register communications after initialization as follows. Initially sending logic circuit reset values associated with the internal register to addresses in the context switching memory that are cross-referenced to initialized channels. As shown, reset values are sent for channels 1 and 2 (addresses 306 and 308, respectively). Output reset values are initially sent that are associated with the output register to addresses in the context switching module that are cross-referenced to the initialized channels. As shown, reset values are sent for channels 1 and 2 (addresses 404 and 406, respectively).

Further, the logic circuit reset values are initially sent to the input of the combinational logic circuit 310 cross-referenced to channel, and the output reset values are initially sent to the output port 402 cross-referenced to channel.

Figure 9:
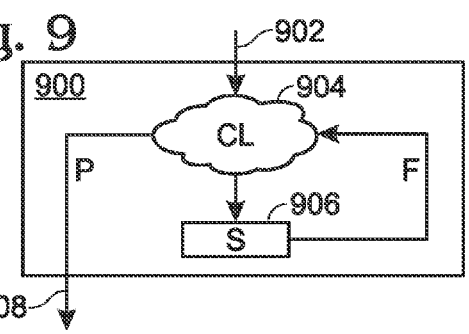
FIG. 9 is a schematic block diagram depicting a generic module design.

FIG. 9 is a schematic block diagram depicting a generic module design. For any module, each register input always comes either from the module inputs on line 902, from another register (S) 906, or from combinational logic (CL) 904. The module outputs on line 908 always come from the module inputs, a register, or from combinational logic 904. The inputs to all combinational logic always come from the module inputs, a register, or from other combinational logic.

Figure 10:
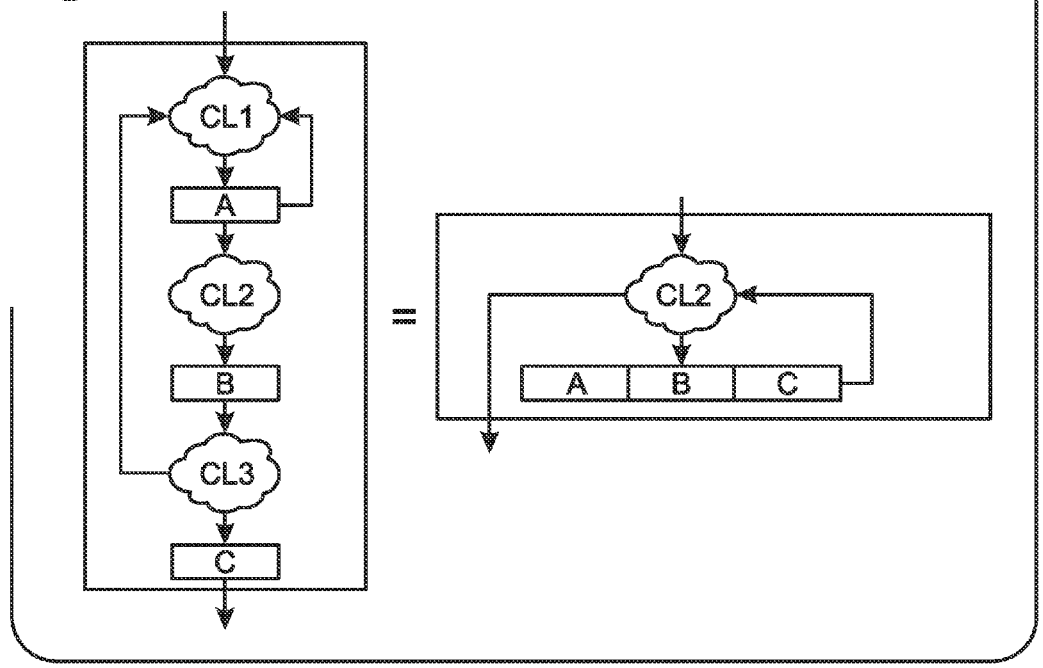
FIG. 10 is a schematic block diagram depicting two example alternate variations of the module in FIG. 9.

FIG. 10 is a schematic block diagram depicting two example alternate variations of the module in FIG. 9. In these modules however, the input may take multiple cycles before affecting the output.

Figure 11:
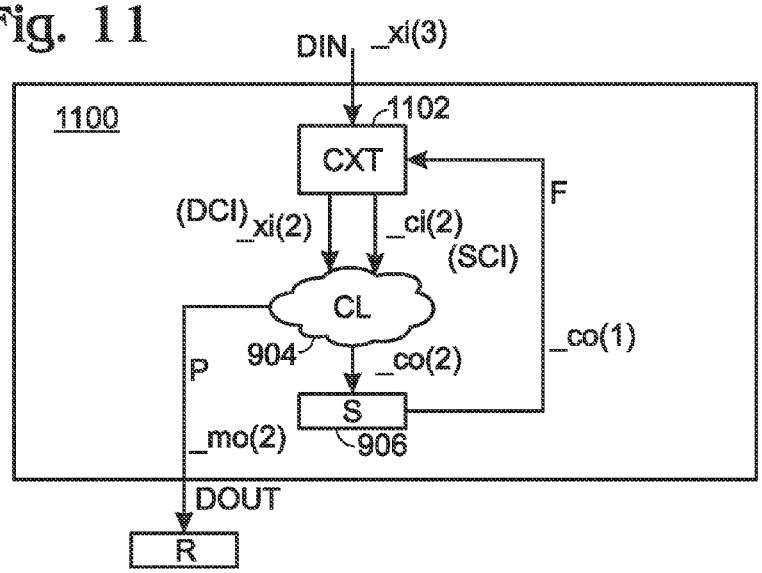
FIG. 11 is a schematic block diagram depicting how the module of FIG. 9 is timesliced.

FIG. 11 is a schematic block diagram depicting how the module of FIG. 9 is timesliced. Assuming that the channels arrive in the order 1, 2, 3, the CXT module 1102 at each cycle:

Receives the input of channel X;
Produces the state of channel X−1; and,
Saves the state of channel X−2.

The "brains" of the timeslicing is the context (CXT) block 1102. The code of the block 1100 does not change other than instantiating and connecting the CXT block in it. In order to connect the CXT module 1102, no knowledge of the functionality of the timesliced module is required. A tool (e.g., Perl script) has been written that automatically instantiates and connects the CXT module. The general idea is as follows. Wherever a register value is used, replace it with the value that is produced from the CXT block. Send the register values only to the CXT block and nowhere else. The same goes for the module inputs—send them to the CXT block, and use the corresponding outputs of the CXT block instead.

Figure 12A:
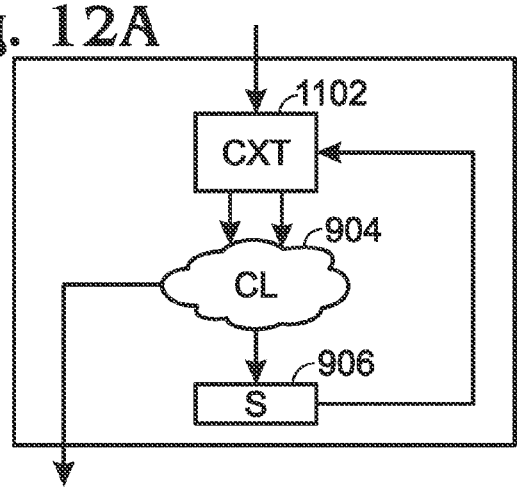
FIGS. 12A through 12C are schematic block diagrams depicting variations of the timeslice solution presented in FIG. 11.
Figure 12B:
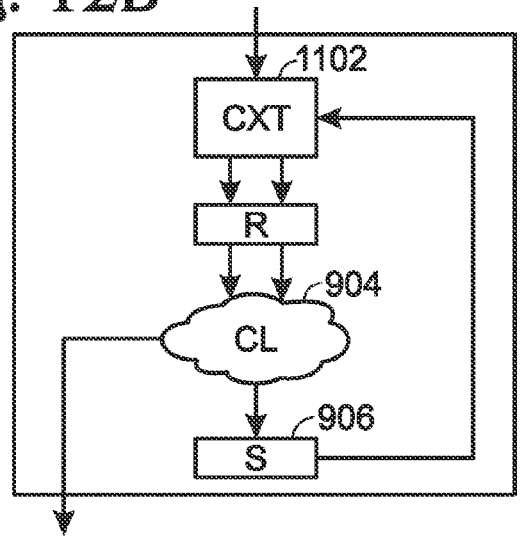
Figure 12C:
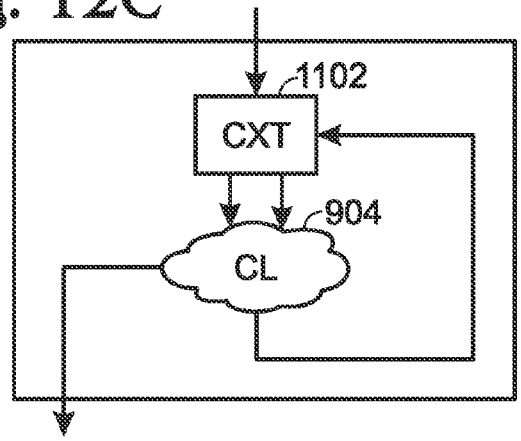

FIGS. 12A through 12C are schematic block diagrams depicting variations of the timeslice solution presented in FIG. 11. The solution of FIG. 12A does not add extra register states, and increases path delay by the RAM read time. The solution of FIG. 12B does not increase timing path delays, but doubles the number of state registers by registering the output of the CXT module. Note: the bus width does not change. The timeslice solution of FIG. 12C removes the state from the module, however, it greatly increases the timing path delays, and is harder to automate. In all solutions the register S can be moved inside the CXT block 1102. This increases the flexibility in terms of registering.

FIG. 13 is a schematic block diagram depicting a design that moves the location of the CXT block moved outside the block. In order to timeslice a block that contains a hierarchy with multiple instances, it can be treated as a flat design with all registers timesliced together. Multiple modules (not shown) may thus be connected to a common CXT module.

FIG. 14 is a schematic block diagram depicting a multi-level design with the CXT block moved outside the block. Timeslicing a block may be viewed as a flat design with all the registers timesliced together, with a single external CXT block. Multiple levels of hierarchy are treated the same way. The entire block processes one channel at each clock cycle. Each module is modified so that all register values are sent to the module outputs and then to the CXT block. The register reset values also need to be sent. For each register, a corresponding timesliced input is declared coming from the CXT block. Everywhere the register value was originally used (including module outputs), the timesliced input values are used instead. External inputs to the block need to be timesliced through the CXT block before being sent to the logic that uses them. All registers need to be refreshed at each clock cycle. The changes do not require any knowledge of the functionality of the block/modules and can be automated using appropriate software.

One can also do "module level" timeslicing, i.e. timeslicing each module separately and sending the output of one module (channel, data) to the input of the next module. Top level timeslicing has many advantages over module level timeslicing. It is easier to implement and verify. Also, when there is a dependency between nonconsecutive stages (feed forward, feed backward, dependency on constant latency, etc.), the module level timeslicing model will fail. Furthermore, with module level timeslicing, all module inputs need to be timesliced, thus greatly increasing the saved state. Whereas with top-level timeslicing, all module inputs except global ones are simply internal wires. With top-level timeslicing single channel design is fully preserved. Simply removing the CXT block and hardwiring the incoming to the outgoing state produces an equivalent to the original single-channel design. A single CXT module and a single RAM can be used for the entire design, not one per module instance.

FIG. 16 depicts a timing diagram associated with the module of FIG. 11, assuming that the same channel does not arrive in consecutive or nearly consecutive cycles. If a channel is received for a second time before the CXT block has had enough time to write and read its state to/from the memory, its state needs to be bypassed. The CXT module thus needs to save the recently received state in registers, so that it can be bypassed if necessary. This is taken care of automatically inside the CXT module, and is transparent to the user. However saving the state X times increases by a factor of X the number of required registers. The "bypass window" (BW) is the maximum number of cycles between consecutive arrivals of the same channel that force the bypass of a channel's state. The context block CXT needs to save (BW-1) times the state in registers. For the CXT model described earlier in FIGS. 11 and 16, BW=2, and thus the state needs to be saved one additional time in registers. If the memory output is directly registered, BW is 3. A CXT module that does not register the RAM outputs, for example, can be swapped with one that does, without affecting the rest of the design.

FIG. 17 is a timing diagram for the module of FIG. 11, with state bypassing. A special case occurs if the same channel is received back-to-back (A, A, A, B, . . . ). The state can then be directly bypassed through a multiplexor and there is no need to save the state in registers. When the same channel is received with at least three cycles of distance between (A, B, C, A, . . . ) there is enough time to go to the memory (when BW=2). However, when the same channel is received with only two cycles of distance between (A, B, A, . . . ) there is a need to have a saved (registered) state to send. This increases the number of state registers by a factor of 2.

One solution, in order to avoid doubling the state, is to reorder the channels at the input. Instead of (A, B, A, . . . ), channels (A, A, B, . . . ) are processed. This reordering can automatically be taken care of by the CXT module, transparent to the user. If channel reordering at the output is not allowed by the interface, the channels can be reordered again back to the original order at the output. Reordering the channels requires registering the module inputs one more time. However the inputs often are negligible compared to the internal state.

FIGS. 18A and 18B are, respectively, single-channel and timesliced modules with memory. For the most part, the timeslicing methodology remains the same. In this example, channel 3 is received. Channel 2 is processed, and channel 1's state is saved. The memory size is multiplied by the number of channels. The CXT block does not need to change; it treats the memory read_data as just another state. The read_addr and write_addr that are sent to the memory are concatenated with the cid coming out of the CXT block: {cid, read_addr}, {cid, write_addr}. Once again, there is no need to have any knowledge of the module functionality, which means that the connections can be automated using a software tool.

The first step to any timesliced design is to build and verify a single-channel version of the block. The single-channel version should be optimized, so that the total register bits are reduced as much as possible. Care must be taken to remove unused registers. One should allocate time for potential timing issues after timeslicing, since all paths will increase by a memory read delay. However, one solution is to register all outputs of the CXT module as shown in FIG. 12B. This solution doubles the number of registers in the design, but reduces critical paths.

The steps for timeslicing a single-channel module are listed below. These steps can be automated using a software tool. The steps are:

1) Find all outputs of the module that are declared as registers. Replace them with wire declarations with the same name. For each such output <outname>, add a register declaration named <outname>_co with the same bit width. Replace all occurrences of <outname> in the design with <outname>_co. For example, replace this output reg [Y:0] out1,

. . . .

out1<=out1+xyz;

with this:

output [Y:0] out1,

. . . .

reg [Y:0] out1_co;

. . . .

out1_co<=out1_co+xyz;

2) Find all registers now declared inside the module (including the new _co registers). These registers will be called "state registers".

3) For each state register <regname> whose name does not end in '_co' (i.e. all pre-existing registers), add a wire declaration named <regname>_ci. For example, for this register:

reg [Y:0] sig1, add this declaration:

wire [Y:0] sig1_ci,

4) Find the total bit width S of all state registers.

5) Select a unique context name <cxtname> for this module and add the following ports:

input [S-1:0] <cxtname>_cxt_inp, output [S-1:0] <cxtname>_cxt_rst, output [S-1:0] <cxtname>_cxt_out, 6) Find the reset values of all state registers.

7) Add the following assign commands to the module:

assign <cxtname>_cxt_out={<all state reg's concatenated>};

assign <cxtname>_cxt_rst={<reset value of all state reg's concat'ed>};

assign {<all_ci wires concat'ed>=<cxtname>_cxt_inp;

The concatenated signals should appear in the same order in all 3 assign statements. Specifically for the _co state registers, use the corresponding output wire in the _ci wires list.

8) For each state register, find all occurrences of the register in the module except LHS (left hand side) assignments. Replace all such occurrences with the corresponding _ci wire signal. For the _co registers, use the corresponding output wire instead. For example:

if (out1_co==2'd0) sig1<=sig1+out1_co+3'd2;

replace with this:

if (out1=2'd0) sig1<=sig1_ci+out1+3'd2;

10) For each state register, find the "always" block that modifies this register. At the beginning of that block, before the first command that modifies any register, add a command like this one:

<regname><=<regname>_ci;

For the _co registers, use the corresponding output wire instead of the _ci wire. For example, add these commands:

sig1<=sig1_ci;

out1_co<=out1;

Below is an example of a timeslicing transformation.

| Original module: |
| --- |
| module example ( |
|   input                                                clk, |
|   input                                                rst_l, |
|   input                     [15:0]             datain, |
|   output      reg         [15:0]             count, |
|   output                    [31:0]             outval |
| ); |
|   reg         [1:0]      flag; |
|   wire                incr = (flag == 2' d0) ? 1 : 0; |
|   assign outval = count + datain; |
|   always @ (posedge clk or negedge rst_l) begin |
|     if (~rst_l) begin |
|       count     <= 16'habcd; |
|       flag       <= 0; |
|     end else begin |
|       flag      <= flag + 2'd1; |
|       if (incr) count <= count + 16'd1; |
|     end |
|   end |
| endmodule |

| Timesliced module: | | |
| --- | --- | --- |
| module example ( | | |
| input                       clk, | | Steps |
| input                       rst_l, | | |
| input       [15:0]      datain, | | |
| output    [15:0]      count, | | See 0 |
| output    [31:0]      outval, | | |
| input       [17:0]      exm_cxt_inp, | | |
| output    [17:0]      exm_cxt_rst, | | See 0 |
| output    [17:0]      exm_cxt_out | | |
| ); | | |
| // TIMESLICE NOTE: Declarations | | See 0 |
| reg        [15:0]      count_co; | | See 0 |
| wire      [1:0]       flag_ci: | | |
| reg        [1:0]       flag; | | See 0 |
| wire                 incr = (flag_ci == 2'd0)? 1 : 0; | | |
| // TIMESLICE NOTE: Context assigns | | See 0 |
| assign exm_cxt_out       = {count_co, flag}; | | |
| assign exm_cxt_rst        = {16'habcd, 2'd0}; | | |
| assign {count, flag_ci}    = exm_cxt_inp; | | |
| assign outval = count + datain; | | See 0 |
| always @ (posedge clk or negedge rst_l) begin. | | |
|   if (~rst_l) begin | | |
|     count_co    <= 16'habcd; | | |
|     flag         <= 0; | | |
|   end else begin | | See 0 |
|     // TIMESLICE NOTE: Assign default | | |
|     values to registers | | See 0, 0 |
|     count_co <= count; | | |
|     flag       <= flag_ci; | | |
|     flag       <= flag_ci + 2'd1; | | |
|     if (incr) count_co <= count + 16'd1; | | |
|   end | | |
| end | | |
| endmodule | | |

FIG. 15 is a flowchart illustrating a method for automatically converting a hardware abstraction language representation of a single-channel hardware module into a hardware abstraction language representation of a multi-channel module. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1900.

Step 1902 provides a hardware abstraction language representation of a single-channel hardware module having an input port, output port, and a register. Step 1904 defines a number of channels. Step 1906 establishes a context switching memory. Step 1908 creates commands for intercepting register communications. Step 1910 creates commands for storing the intercepted communications in a context switching memory, cross-referenced to channel. Step 1912 operates the module using the created commands and stored communications from the context switching memory.

In one aspect, Step 1905 creates commands for determining a context switch from a first channel to a second channel. Then, creating commands for intercepting register communications in Step 1908 includes substeps. Step 1908a sends an output value to the context switching memory, redirected from the register, cross-referenced to the first channel. Step 1908b receives an output value from the context switching memory that is associated with the register and cross-referenced to the second channel.

In another aspect, providing the hardware module in Step 1902 includes providing the hardware module with an internal register and a combinational logic circuit. Then, Step 1908a sends data from an output of the internal register to a context switching memory first address associated with the internal register and cross-referenced to first channel. In Step 1908b an input to the combinational logic circuit receives data from a context switching memory second address associated with the internal register and cross-referenced to a second channel. This data is processed and supplied to the input of the internal register. For example, receiving data from the context switching memory second address in Step 1908b may include additional substeps. Step 1908b1 creates a timesliced input declaration associated with the internal register. Step 1908b2 loads data received from the context switching memory second address into the timesliced input declaration.

In another aspect, Step 1902 provides an output register associated with the output port. Then, Step 1908a sends data from the output of the output register to the context switching memory third address associated with the output register and cross-referenced to a first channel. In Step 1908b the single channel output port receives data from a context switching memory fourth address associated with the output register and cross-referenced to a second channel. Receiving data from the context switching memory fourth address may include substeps. Step 1908b1 creates a timesliced output declaration associated with the single channel output port. Step 1908b2 loads data received from the context switching memory fourth address into the timesliced output declaration.

Further, Step 1902 may provide a hardware module with an internal register, combinational logic circuit, and an output register associated with the output port. Then, Step 1908a creates a hardware module output bus command for sending data from an output of the internal register to a context switching memory first address associated with the internal register and cross-referenced to channel. The output bus also sends data from the output of the output register to a context switching memory third address associated with the output register and cross-referenced to channel. Step 1908b creates a hardware module input bus command for sending data to an input of the combinational logic circuit from a context switching memory second address associated with the internal register and cross-referenced to channel, which is supplied to the input of the internal register after processing. The input bus also sends data to the output port from a context switching memory fourth address associated with the output register and cross-referenced to channel.

In a different aspect, Step 1902 provides the hardware module with an internal register and a combinational logic circuit, and creates commands for intercepting register communications in Step 1908 with the following substeps. In a first clock period, and in response to determining that the context switch is set to the first channel, Step 1908c sends data from an output of the internal register to a context switching memory first address associated with the internal register and cross-referenced to the first channel. In a subsequent clock period occurring after the first clock period, and in response determined that the context switch has been reset to the first channel, an input to the combinational logic circuit receives data from the context switching memory first address in Step 1908d, which is supplied to the input of the internal register after processing.

Likewise, if Step 1902 provides an output register associated with the output port, Step 1908c, in a first clock period, and in response to determining that the context switch is set to the first channel, sends data from the output register to the context switching memory third address associated with the output register and cross-referenced to the first channel. In a subsequent clock period occurring after the first clock period, and in response to determining that the context switch has been reset to the first channel, the output port receives data from a context switching memory third address in Step 1908d.

In a different aspect, creating commands for intercepting register communications in Step 1908 includes the following substeps. In response to initializing, Step 1908e initially sends logic circuit reset values associated with the internal register to addresses in the context switching memory that are cross-referenced to initialized channels. Step 1908f initially sends output reset values associated with the output register to addresses in the context switching module that are cross-referenced to the initialized channels. Step 1908g initially sends the logic circuit reset values to the input of the combinational logic circuit, cross-referenced to channel, and initially sends output reset values to the output port, cross-referenced to channel.

A system and method have been provided for converting a hardware abstraction language representation of a single-channel hardware module into a hardware abstraction language representation of a multi-channel hardware module. Examples of particular instructions and hardware units have been presented to illustrate the invention. However, the invention is not limited to merely these examples. Other variations and embodiments of the invention will occur to those skilled in the art.

I claim:

1. A method for automatically converting a hardware abstraction language representation of a single-channel hardware module into a hardware abstraction language representation of a multi-channel module, comprising:
   providing a hardware abstraction language representation of a single-channel hardware module having an input port, output port, and a register;
   defining a number of channels;
   establishing a context switching memory;
   creating commands for intercepting register communications;
   creating commands for storing the intercepted communications in a context switching memory, cross-referenced to at least one of the number of channels; and,
   operating the module using the created commands and stored communications from the context switching memory, where the defining, establishing, creating, and operating acts are performed by a processor.

2. The method of claim 1 further comprising:
   creating commands for determining a context switch from a first channel to a second channel;
   wherein creating commands for intercepting register communications comprises:
      sending an output value to the context switching memory, redirected from the register, cross-referenced to the first channel; and,
      receiving an output value from the context switching memory that is associated with the register and cross-referenced to the second channel.

3. The method of claim 2 wherein providing the hardware module comprises providing the hardware module with an internal register and a combinational logic circuit;
   wherein creating commands for intercepting register communications comprises:
      sending data from an output of the internal register to a context switching memory first address associated with the internal register and cross-referenced to the first channel;
      an input to the combinational logic circuit receiving data from a context switching memory second address associated with the internal register and cross-referenced to the second channel; and,
      an input to the internal register received processed data from an output of the combinational logic circuit associated with the second channel.

4. The method of claim 3 wherein the combinational logic circuit receiving data from the context switching memory second address comprises:
   creating a timesliced input declaration associated with the internal register; and,
   loading data received from the context switching memory second address into the timesliced input declaration.

5. The method of claim 2 wherein providing the hardware module comprises providing the hardware module with an internal register and a combinational logic circuit;
   wherein creating commands for intercepting register communications comprises:
      in a first clock period, and in response to determining that the context switch is set to the first channel, sending data from an output of the internal register to a context switching memory first address associated with the internal register and cross-referenced to the first channel; and,
      in a subsequent clock period occurring after the first clock period, and in response determined that the context switch has been reset to the first channel, an input to the combinational logic circuit receiving data from the context switching memory first address.

6. The method of claim 2 wherein providing the hardware module comprises providing an output register associated with the output port;
   wherein creating commands for intercepting register communications comprises:
      in a first clock period, and in response to determining that the context switch is set to the first channel, sending data from the output register to a context switching memory third address associated with the output register and cross-referenced to the first channel; and,
      in a subsequent clock period occurring after the first clock period, and in response to determining that the context switch has been reset to the first channel, the output port receiving data from the context switching memory third address.

7. The method of claim 1 wherein providing the hardware module comprises providing an output register associated with the output port;
   wherein creating commands for intercepting register communications comprises:
      sending data from the output of the output register to a context switching memory third address associated with the output register and cross-referenced to a first channel; and,
      the output port receiving data from a context switching memory fourth address associated with the output register and cross-referenced to a second channel.

8. The method of claim 7 wherein the output port receiving data from the context switching memory fourth address comprises:
   creating a timesliced output declaration associated with the single channel output port; and,
   loading data received from the context switching memory fourth address into the timesliced output declaration.

9. The method of claim 1 wherein providing the hardware module comprises providing the hardware module with a combinational logic circuit, an internal register, and an output register associated with the output port;
   wherein creating commands for intercepting register communications comprises:
      creating a hardware module output bus command for sending data from an output of the internal register to a context switching memory first address associated with the internal register and cross-referenced to at least one of the number of channels, and
      sending data from the output of the output register to a context switching memory third address associated with the output register and cross-referenced to at least one of the number of channels; and,
      creating a hardware module input bus command for sending data to an input of the combinational logic circuit from a context switching memory second address associated with the internal register and cross-referenced to at least one of the number of channels, and sending data to the output port from a context switching memory fourth address associated with the output register and cross-referenced to at least one of the number of channels.

10. The method of claim 9 wherein creating commands for intercepting register communications comprises:
    in response to initializing:
       initially sending logic circuit reset values associated with the internal register to addresses in the context switching memory that are cross-referenced to initialized channels;
       initially sending output reset values associated with the output register to addresses in the context switching module that are cross-referenced to the initialized channels; and,
       initially sending the combinational logic circuit reset values to the input of the combinational logic circuit, cross-referenced to at least one of the number of channels, and initially sending output reset values to the output port, cross-referenced to at least one of the number of channels.

11. A system for automatically converting a single-channel hardware module into a multi-channel module, the system comprising:

a pre-processor having an input to accept a hardware abstraction language representation of a single-channel hardware module, a user interface to accept a command selecting a number of channels (n), and an output to supply a hardware abstraction language representation of an n-channel module;
a compiler having an input to accept the hardware abstraction language representation of the n-channel module, and supplying a net list representing a combination of logic gates enabling the n-channel module; and,
a routing module having an input to accept the net list and an output for supplying an instantiated n-channel module in a device selected from a group consisting of a field programmable gate array (FPGA) and an application-specific integrated circuit (ASIC),
   wherein the pre-processor creates commands for determining a context switch from a first channel to a second channel, and creates commands for intercepting register communications by sending an output value to a context switching memory, redirected from a register, cross-referenced to the first channel, and receiving an output value from the context switching memory that is associated with the register and cross-referenced to the second channel.

12. The system of claim 11 wherein the hardware abstraction language representation of the single-channel module comprises an internal register and a combinational logic circuit; and,
    wherein the pre-processor creates commands for intercepting register communications by sending data from an output of the internal register to a context switching memory first address associated with the internal register and cross referenced to first channel, by having an input to the combinational logic circuit receive data from a context switching memory second address associated with the internal register and cross-referenced to a second channel, and by having an input to the internal register receive processed data from an output of the logic circuit, cross referenced to the second channel.

13. The system of claim 12 wherein the pre-processor creates commands for receiving data from the context switching memory second address by creating a timesliced input declaration associated with the internal register and loading data received from the context switching memory second address into the timesliced input declaration.

14. The system of claim 11 wherein the hardware abstraction language representation of the single-channel hardware module comprises an internal register and a combinational logic circuit;
    wherein the pre-processor creates commands for intercepting register communications by:
       in a first clock period, and in response to determining that the context switch is set to the first channel, sending data from an output of the internal register to a context switching memory first address associated with the internal register and cross-referenced to the first channel; and,
       in a subsequent clock period occurring after the first clock period, and in response determined that the context switch has been reset to the first channel, an input to the combinational logic circuit receiving data from the context switching memory first address.

15. The system of claim 11 wherein the hardware abstraction language representation of the single-channel hardware module comprises an output register associated with the output port;

wherein the pre-processor creates commands for intercepting register communications by:
in a first clock period, and in response to determining that the context switch is set to the first channel, sending data from the output register to a context switching memory third address associated with the output register and cross-referenced to the first channel; and,
in a subsequent clock period occurring after the first clock period, and in response to determining that the context switch has been reset to the first channel, the output port receiving data from the context switching memory third address.

16. A system for automatically converting a single-channel hardware module into a multi-channel module, the system comprising:
a pre-processor having an input to accept a hardware abstraction language representation of a single-channel hardware module, a user interface to accept a command selecting a number of channels (n), and an output to supply a hardware abstraction language representation of an n-channel module;
a compiler having an input to accept the hardware abstraction language representation of the n-channel module, and supplying a net list representing a combination of logic gates enabling the n-channel module; and,
a routing module having an input to accept the net list and an output for supplying an instantiated n-channel module in a device selected from a group consisting of a field programmable gate array (FPGA) and an application-specific integrated circuit (ASIC),
wherein providing the hardware abstraction language representation of the single-channel hardware module comprises providing an output register associated with the output port; and,
wherein the pre-processor creates commands for intercepting register communications by sending data from the output of the output register to a context switching memory third address associated with the output register and cross-referenced to a first channel, and by having the output port receive data from a context switching memory fourth address associated with the output register and cross-referenced to a second channel.

17. The system of claim 16 wherein the pre-processor has the output port receive data from the context switching memory fourth address by creating a timesliced output declaration associated with the single channel output port, and by loading data received from the context switching memory fourth address into the timesliced output declaration.

18. A system for automatically converting a single-channel hardware module into a multi-channel module, the system comprising:
a pre-processor having an input to accept a hardware abstraction language representation of a single-channel hardware module, a user interface to accept a command selecting a number of channels (n), and an output to supply a hardware abstraction language representation of an n-channel module;
a compiler having an input to accept the hardware abstraction language representation of the n-channel module, and supplying a net list representing a combination of logic gates enabling the n-channel module; and,
a routing module having an input to accept the net list and an output for supplying an instantiated n-channel module in a device selected from a group consisting of a field programmable gate array (FPGA) and an application-specific integrated circuit (ASIC),
wherein the hardware abstraction language representation of the single-channel hardware module includes an internal register, a combinational logic circuit, and an output register associated with the single channel output port;
wherein the pre-processor creates commands for intercepting register communications by:
creating a hardware module output bus command for sending data from an output of the internal register to a context switching memory first address associated with the internal register and cross-referenced to channel, and sending data from the output of the output register to a context switching memory third address associated with the output register and cross-referenced to channel; and,
creating a hardware module input bus command for sending data to an input of the combinational logic circuit from a context switching memory second address associated with the internal register and cross-referenced to channel, and sending data to the output port from a context switching memory fourth address associated with the output register and cross-referenced to channel.

19. The system of claim 18 wherein the pre-processor creates commands for intercepting register communications after initialization as follows:
initially sending logic circuit reset values associated with the internal register to addresses in the context switching memory that are cross-referenced to initialized channels;
initially sending output reset values associated with the output register to addresses in the context switching module that are cross-referenced to the initialized channels; and,
initially sending the combinational logic circuit reset values to the input of the combinational logic circuit, cross-referenced to initialized channels, and initially sending output reset values to the output port, cross-referenced to initialized channels.

* * * * *